(12) United States Patent
Lee

(10) Patent No.: US 8,456,600 B2
(45) Date of Patent: Jun. 4, 2013

(54) ARRAY SUBSTRATE FOR IN-PLANE SWITCHING MODE LIQUID CRYSTAL DISPLAY DEVICE

(75) Inventor: Won-Ho Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 180 days.

(21) Appl. No.: 13/087,560

(22) Filed: Apr. 15, 2011

(65) Prior Publication Data

US 2011/0267571 A1 Nov. 3, 2011

(30) Foreign Application Priority Data

Apr. 29, 2010 (KR) .................... 10-2010-0040110

(51) Int. Cl.
G02F 1/1343 (2006.01)
G02F 1/1368 (2006.01)
G02F 1/139 (2006.01)

(52) U.S. Cl.
USPC ............ 349/141; 349/129; 349/143; 349/187

(58) Field of Classification Search
USPC .... 349/129, 139, 141, 143, 145, 187; 345/92; 438/30; 257/59, 72
See application file for complete search history.

(56) References Cited

U.S. PATENT DOCUMENTS

| | | | | |
|---|---|---|---|---|
| 6,839,117 B1* | 1/2005 | Park et al. | ...................... | 349/141 |
| 2004/0263748 A1* | 12/2004 | Park et al. | ...................... | 349/141 |
| 2005/0140897 A1* | 6/2005 | Kim | .............................. | 349/141 |
| 2006/0279668 A1* | 12/2006 | Paik et al. | ........................ | 349/43 |
| 2007/0152939 A1* | 7/2007 | Kim et al. | ........................ | 345/94 |
| 2008/0151169 A1* | 6/2008 | Park et al. | ..................... | 349/143 |

* cited by examiner

*Primary Examiner* — Dung Nguyen
*Assistant Examiner* — Tai Duong
(74) *Attorney, Agent, or Firm* — Morgan, Lewis & Bockius LLP

(57) ABSTRACT

An array substrate for an in-plane switching mode liquid crystal display device includes a gate line on a substrate including a pixel region, the pixel region including a first domain at a lower side with respect to the gate line and a second domain at an upper side with respect to the gate line; a data line crossing the gate line; a thin film transistor in the pixel region and at a crossing portion of the gate and data lines; a plurality of first pixel electrodes in the first domain; a plurality of second pixel electrodes in the second domain, the plurality of first pixel electrodes and plurality of second pixel electrodes sharing the thin film transistor; a plurality of first common electrodes in the first domain and alternately arranged with the plurality of first pixel electrodes; and a plurality of second common electrodes in the second domain and alternately arranged with the plurality of second pixel electrodes.

20 Claims, 11 Drawing Sheets

ARRAY SUBSTRATE FOR IN-PLANE SWITCHING MODE LIQUID CRYSTAL DISPLAY DEVICE

The present application claims the benefit of Korean Patent Application No. 10-2010-0040110 filed in Korea on Apr. 29, 2010, which is hereby incorporated by reference.

BACKGROUND OF THE INVENTION

1. Field of the Invention

The present invention relates to an in-plane switching (IPS) mode liquid crystal display (LCD) device and more particularly to an array substrate for an IPS mode LCD device being capable of preventing a color shift problem and increasing an aperture ratio.

2. Discussion of the Related Art

A related art liquid crystal display (LCD) device uses optical anisotropy and polarization properties of liquid crystal molecules. The liquid crystal molecules have a definite alignment direction as a result of their thin and long shapes. The alignment direction of the liquid crystal molecules can be controlled by applying an electric field across the liquid crystal molecules. In other words, as the intensity or direction of the electric field is changed, the alignment of the liquid crystal molecules also changes. Since incident light is refracted based on the orientation of the liquid crystal molecules due to the optical anisotropy of the liquid crystal molecules, images can be displayed by controlling light transmissivity.

Since the LCD device including a thin film transistor (TFT) as a switching element, referred to as an active matrix LCD (AM-LCD) device, has excellent characteristics of high resolution and displaying moving images, the AM-LCD device has been widely used.

The AM-LCD device includes an array substrate, a color filter substrate and a liquid crystal layer interposed therebetween. The array substrate may include a pixel electrode and the TFT, and the color filter substrate may include a color filter layer and a common electrode. The AM-LCD device is driven by an electric field between the pixel electrode and the common electrode to have excellent properties of transmittance and aperture ratio. However, since the AM-LCD device uses a vertical electric field, the AM-LCD device has a bad viewing angle.

An in-plane switching (IPS) mode LCD device may be used to resolve the above-mentioned limitations. FIG. 1 is a cross-sectional view of an IPS mode LCD device according to the related art. As shown in FIG. 1, the array substrate and the color filter substrate are separated and face each other. The array substrate includes a first substrate 10, a common electrode 17 and a pixel electrode 30. Though not shown, the array substrate may include a TFT, a gate line, a data line, and so on. The color filter substrate includes a second substrate 9, a color filter layer (not shown), and so on. A liquid crystal layer 11 is interposed between the first substrate 10 and the second substrate 9. Since the common electrode 17 and the pixel electrode 30 are formed on the first substrate 10 on the same level, a horizontal electric field "L" is generated between the common and pixel electrodes 17 and 30. The liquid crystal molecules of the liquid crystal layer 11 are driven by a horizontal electric field such that the IPS mode LCD device has a wide viewing angle.

FIGS. 2A and 2B are cross-sectional views showing turned on/off conditions of an IPS mode LCD device according to the related art. As shown in FIG. 2A, when the voltage is applied to the IPS mode LCD device, liquid crystal molecules 11a above the common electrode 17 and the pixel electrode 30 are unchanged. But, liquid crystal molecules 11b between the common electrode 17 and the pixel electrode 30 are horizontally arranged due to the horizontal electric field "L". Since the liquid crystal molecules are arranged by the horizontal electric field, the IPS mode LCD device has a characteristic of a wide viewing angle. FIG. 2B shows a condition when the voltage is not applied to the IPS mode LCD device. Because an electric field is not generated between the common and pixel electrodes 17 and 30, the arrangement of liquid crystal molecules 11 is not changed.

FIG. 3 is a plane-view showing one pixel region of an array substrate for an IPS mode LCD device according to the related art.

As shown in FIG. 3, a gate line 43, a common line 47, which is parallel to and spaced apart from the gate line 43, a data line 60, which crosses the gate line 43 to define a pixel region "P", are formed on a substrate 40.

A thin film transistor (TFT) "Tr" is formed at a crossing portion of the gate and data lines 43 and 60. The TFT "Tr" includes a gate electrode 45, a semiconductor layer (not shown), a source electrode 53 and a drain electrode 55. The source electrode 53 and the gate electrode 45 respectively extend from the data line 60 and the gate line 53 such that the TFT "Tr" is connected to the data line 60 and the gate line 43.

In addition, a plurality of pixel electrodes 70a and 70b, which are electrically connected to the drain electrode 55 through a drain contact hole 67, and a plurality of common electrodes 49a and 49b are formed in the pixel region "P". The common electrodes 49a and 49b are alternately arranged with the pixel electrodes 70a and 70b and extend from the common line 47.

Unfortunately, since a single domain is generated in one pixel region, there are color shift problems at upper-right, upper-left, lower-right and lower-left sides. Particularly, a yellow color shift problem is strongly generated at the upper-left side, i.e., 10 o'clock direction, and a blue color shift problem is strongly generated at the upper-right side, i.e., 2 o'clock direction.

To resolve the above color shift problems, an array substrate, where a center of each of the pixel and common electrodes is bent such that the array substrate has a double-domain structure, is introduced.

FIGS. 4A and 4B are schematic views for illustrating an array substrate having a double-domain structure. FIGS. 4A and 4B show a common electrode 80, a pixel electrode 83, a rubbing direction "rb", a first polarizing axis "POL1" and a second polarizing axis "POL2" of polarizing plates, and a director of liquid crystal molecules 90 at a low gray level. The common and pixel electrodes 80 and 83 are symmetrically bent at a center such that a double-domain structure is generated at one pixel region "P". As a result, a color shift problem is prevented by a counterbalance of domains.

In more detail, when the rubbing direction "rb" is parallel to one of the first and second polarizing axis "POL1" and "POL2", which are perpendicular to each other, a director of the liquid crystal molecule 90 at the first domain "D1" and a director of the liquid crystal molecule 90 at the second domain "D2" are perfectly symmetric to each other, as shown FIG. 4B showing a schematic view of a full white mode. As a result, a color shift problem is prevented.

However, as shown in FIG. 4A showing a schematic view of a low gray level mode, a director of the liquid crystal molecule 90 at a first domain "D1" and a director of the liquid crystal molecule 90 at a second domain "D2" is imperfectly symmetric to each other such that a counterbalance of the domains "D1" and "D2" is also imperfect. As a result, a color shift problem is still generated.

In addition, since a boundary of the first and second domains "D1" and "D2" is positioned in the pixel region "P", a light leakage problem is generated. When a light-shielding element, e.g., a black matrix, is formed to prevent the light leakage problem, an aperture ratio is decreased.

SUMMARY OF THE INVENTION

Accordingly, the present invention is directed to an array substrate for an IPS mode LCD device that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an array substrate for an in-plane switching mode liquid crystal display device includes a gate line on a substrate including a pixel region, the pixel region including a first domain at a lower side with respect to the gate line and a second domain at an upper side with respect to the gate line; a data line crossing the gate line; a thin film transistor in the pixel region and at a crossing portion of the gate and data lines; a plurality of first pixel electrodes in the first domain; a plurality of second pixel electrodes in the second domain, the plurality of first pixel electrodes and plurality of second pixel electrodes sharing the thin film transistor; a plurality of first common electrodes in the first domain and alternately arranged with the plurality of first pixel electrodes; and a plurality of second common electrodes in the second domain and alternately arranged with the plurality of second pixel electrodes.

In another aspect of the present invention, a method of fabricating an array substrate for an in-plane switching mode liquid crystal display device includes forming a gate line, a first common line and a second common line on a substrate having a pixel region, the gate line disposed between the first and second common lines; forming a data line over the gate line, the first and second common lines, the data line crossing the first and second common line to define first and second domains in the pixel region, respectively; forming a thin film transistor in the pixel region and at a crossing portion of the gate line and the data line; forming a plurality of first pixel electrodes in the first domain, a plurality of second pixel electrodes in the second domain, a plurality of first common electrodes in the first domain, and a plurality of second common electrodes in the second domain, wherein the plurality of first pixel electrodes and plurality of first pixel electrodes share the thin film transistor, and wherein the plurality of first common electrodes are alternately arranged with the plurality of first pixel electrodes, and the plurality of second common electrodes are alternately arranged with the plurality of second pixel electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

Figure 1:
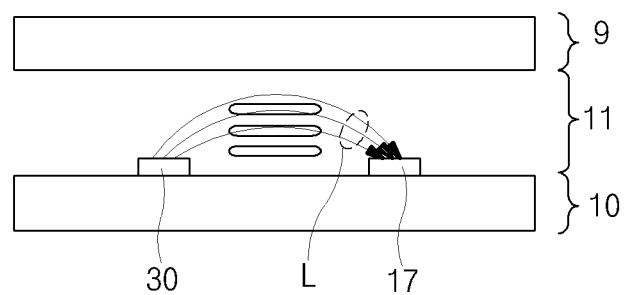
FIG. 1 is a cross-sectional view of an IPS mode LCD device according to the related art.
Figure 2A:
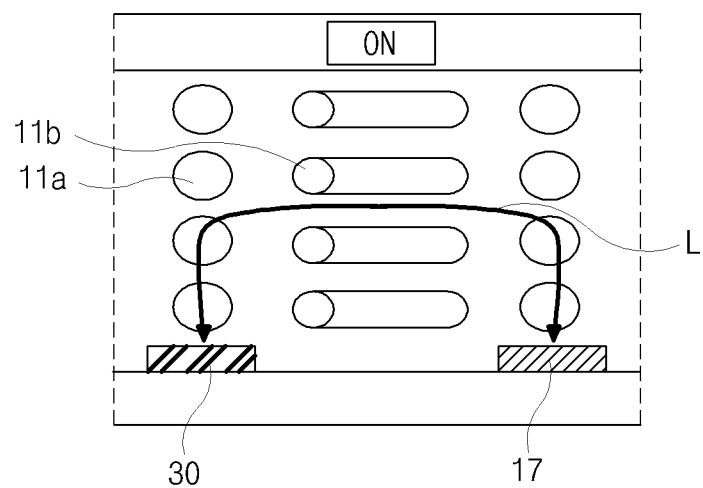
FIGS. 2A and 2B are cross-sectional views showing turned on/off conditions of an IPS mode LCD device according to the related art.
Figure 2B:
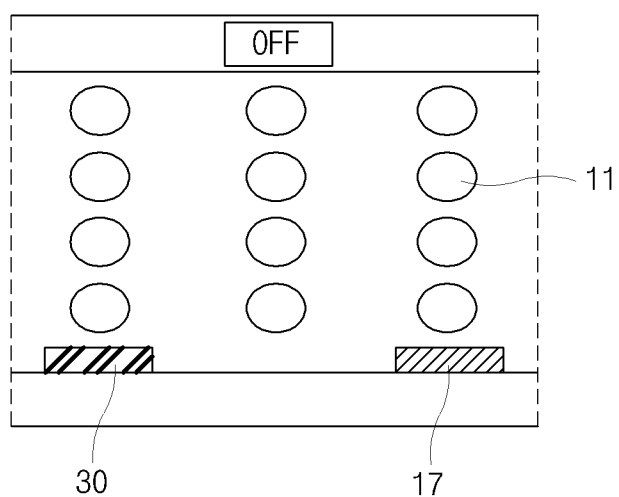
Figure 3:
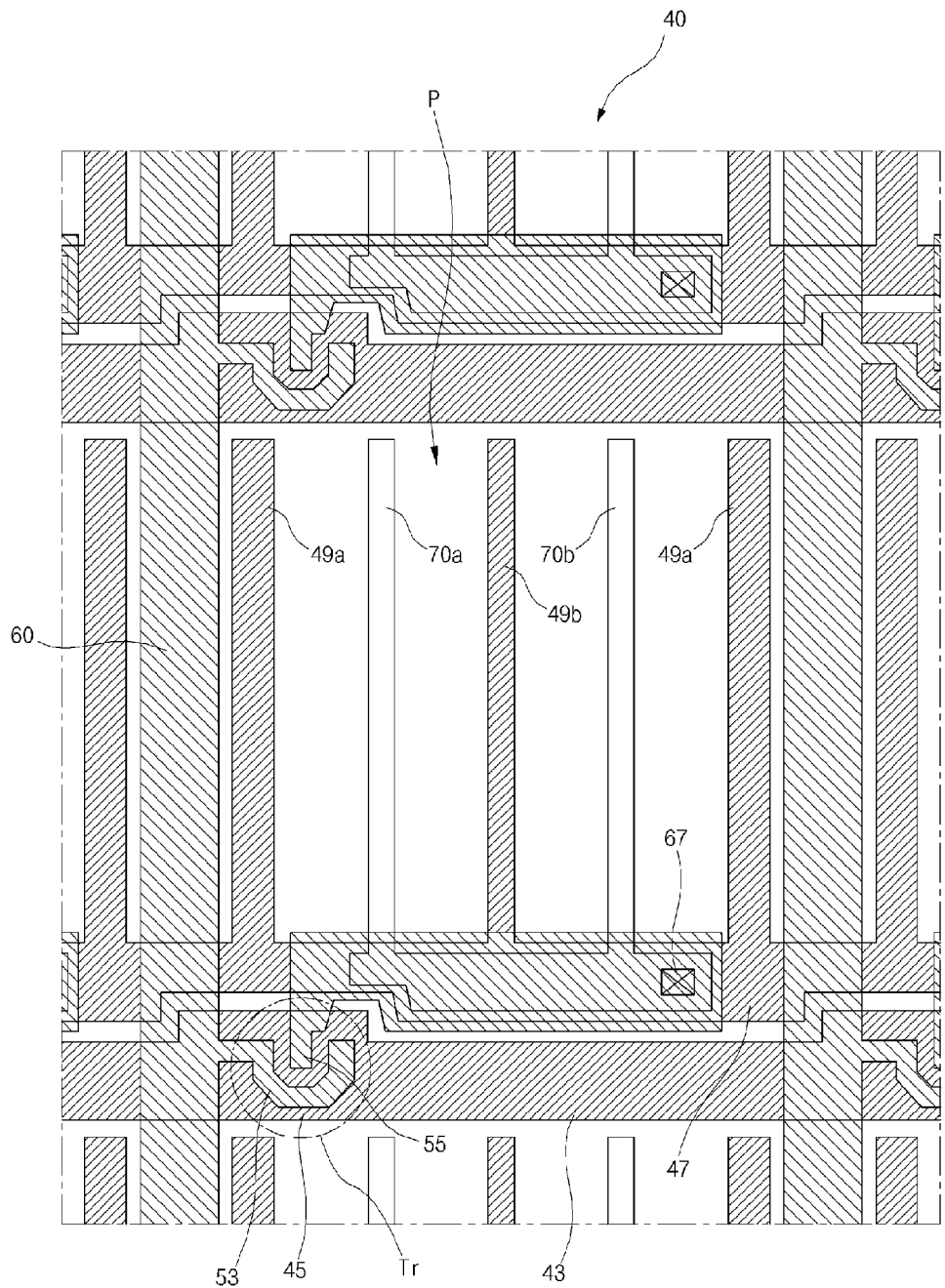
FIG. 3 is a plane-view showing one pixel region of an array substrate for an IPS mode LCD device according to the related art.
Figure 4A:
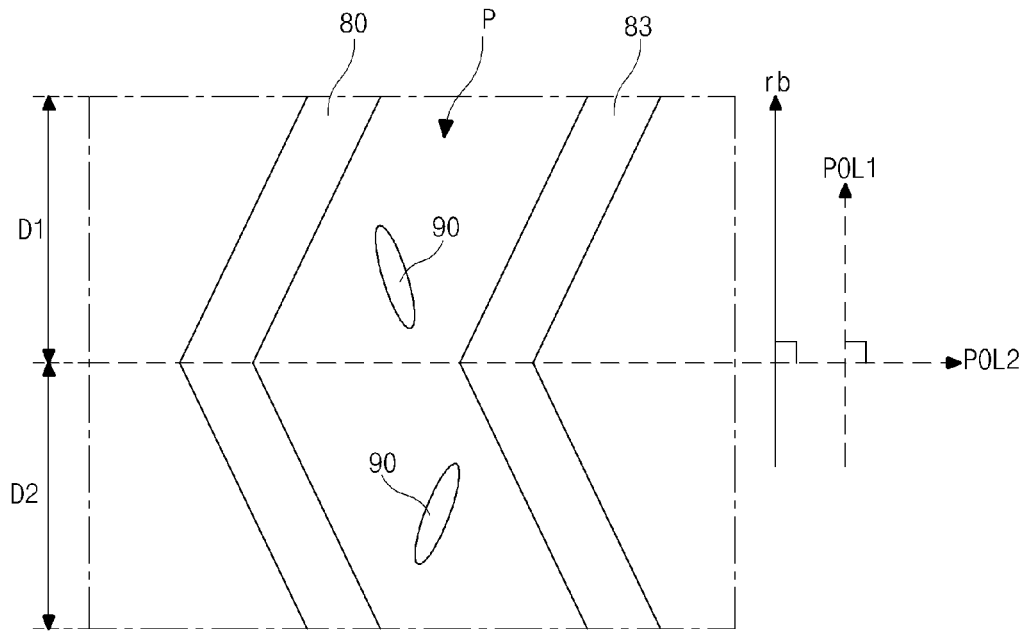
FIGS. 4A and 4B are schematic views for illustrating an array substrate having a double-domain structure.
Figure 4B:
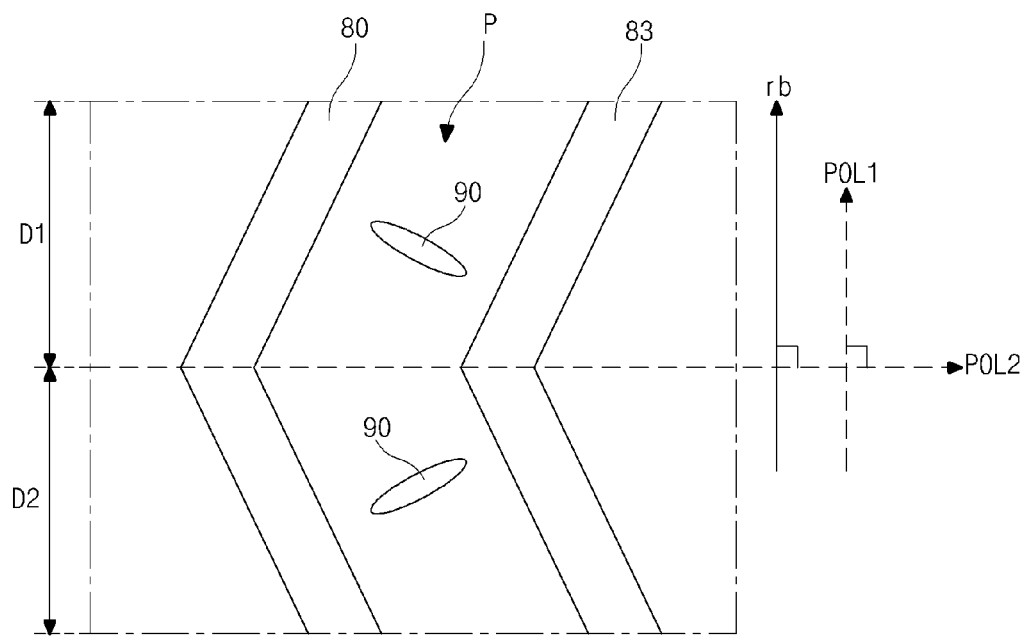
Figure 5:
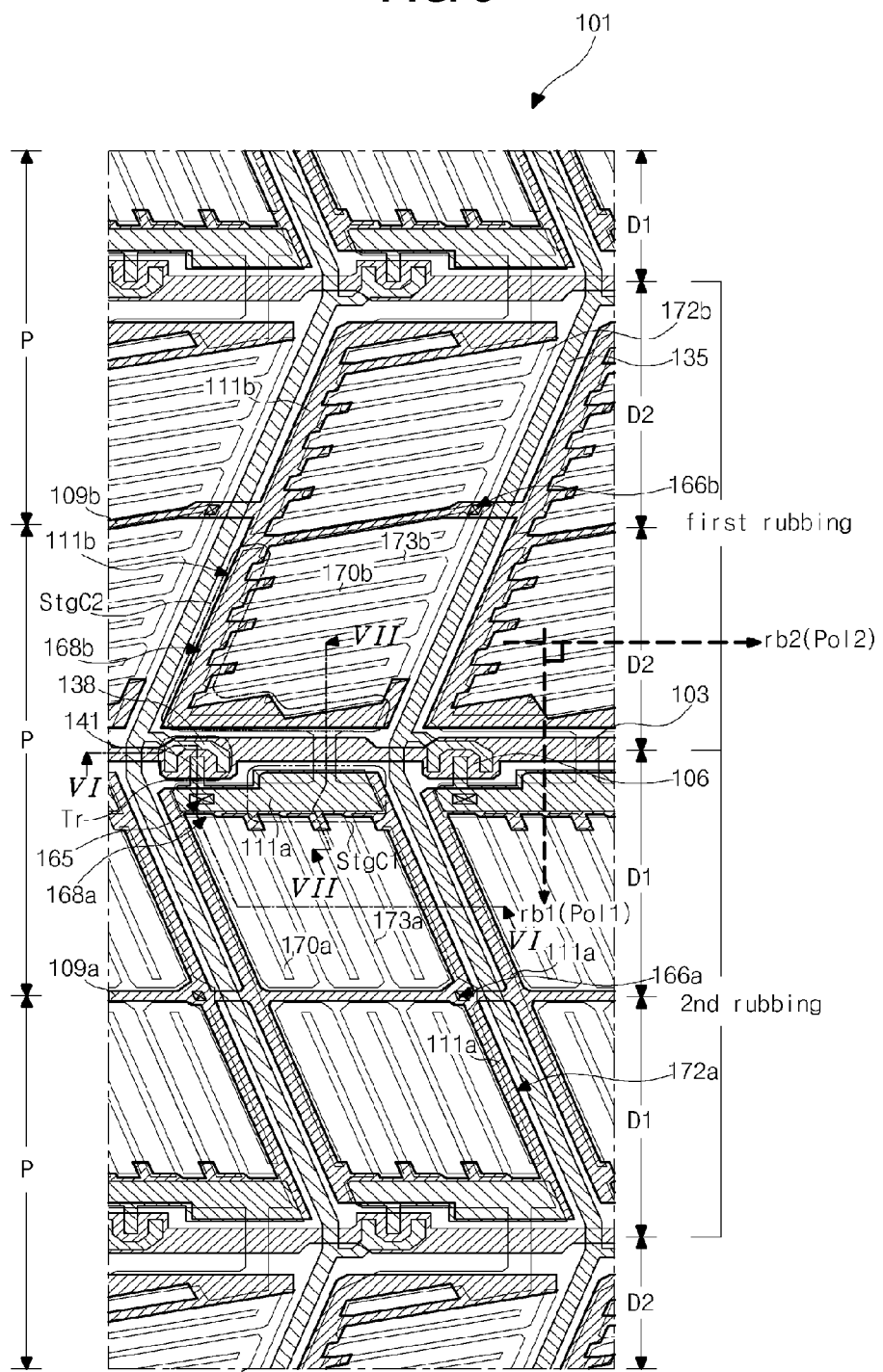
FIG. 5 is a schematic plane-view showing a part of an array substrate for an IPS mode LCD device according to the present invention.

FIG. 5 is a schematic plane-view showing a part of an array substrate for an IPS mode LCD device according to the present invention.

As shown in FIG. 5, a gate line 103 and a data line 135 are formed on a substrate 101. The gate line 103 extends along a direction, e.g., a horizontal direction, and the data line 135 crosses the gate line 103. The data line 135 has a bent portion over the gate line 103. In other word, the data line 135 has a zigzag shape.

First and second common lines 109a and 109b are disposed at the same layer as the gate line 103. The first and second common line 109a and 109b cross the data line 135 to define a pixel region "P". The pixel region "P" is divided into a first domain "D1" and a second domain "D2" with respect to the gate line 103. Namely, the gate line 103 extends across a center of the pixel region "P", and the first and second common lines 109a and 109b are respectively disposed at an end of the first and second domains "D1" and "D2". Namely, the first and second common lines 109a and 109b are respectively disposed at opposite end of the pixel region "P". An alignment layer (not shown) in the first domain "D1" and the second domain "D2" is rubbed along different direction such that liquid crystal molecules in the first domain "D1" and the second domain "D2" have a difference in an initial arrangement. As a result, a boundary of the first domain "D1" and the second domain "D2" is disposed over the gate line 103. Namely, since the boundary of the first domain "D1" and the second domain "D2", which share the TFT "Tr" is disposed over the gate line 103, a light-shielding element for shielding a light leakage through the boundary is not required. Accordingly, decrease of an aperture ratio is prevented.

In addition, since the domains in one pixel region and the domains in adjacent pixel region have different domain arrangements, the color shift problem is further prevented. Namely, a first pixel region including the first domain "D1" at an upper side and the second domain "D2" at a lower side and a second pixel region including the first domain "D1" at a lower side and the second domain "D2" at an upper side are alternately arranged with each other along a direction of the data line 135. In other word, two first domains "D1" and two second domains "D2" are alternately arranged with each other along the direction of the data line 135.

There are a plurality of first pixel electrodes 170a and a plurality of first common electrodes 173a in the first domain "D1", and there are a plurality of second pixel electrodes 170b and a plurality of second common electrodes 173b in the second domain "D2". The first pixel electrodes 170a in the first domain "D1" and the second pixel electrodes 170b in the second domain "D2" share the TFT "Tr". The first pixel electrodes 170a, which are spaced apart from each other, and the first common electrodes 173a, which are spaced apart from each other, are parallel to the data line 135, while the second pixel electrodes 170b, which are spaced apart from each other, and the second common electrodes 173b, which are spaced apart from each other, cross the data line 135.

In each pixel region "P", a thin film transistor (TFT) "Tr" is formed at a crossing portion of the gate line 103 and the data line 135. The TFT "Tr" includes a gate electrode 106, a gate insulating layer (not shown), a semiconductor layer (not shown), a source electrode 138 and a drain electrode 141. The gate line 106 and the source electrode 138 respectively extend from the gate line 103 and the data line 135 such that the TFT "Tr" is electrically connected to the gate and data lines 103 and 135. The drain electrode 141 is spaced apart from the source electrode 138.

In the first domain "D1", a first auxiliary common pattern 111a, which extends from the first common line 109a, is formed along edges of the first domain "D1". In other word, the first auxiliary common pattern 111a forms a rectangular shape with the first common line 109a such that the first domain "D1" is surrounded by the first auxiliary common pattern 111a and the first common line 109a. The drain electrode 141 extends to overlap a portion of the first auxiliary common pattern 111a, which is parallel to the gate line 103, such that a first storage capacitor "StgC1" is formed. Namely, the overlapped portion of the first auxiliary common pattern 111a serves as a first storage electrode of the first storage capacitor "StgC1", and the overlapped portion of the drain electrode 141 serves as a second storage electrode of the first storage capacitor "StgC1".

In addition, a second auxiliary common pattern 172a, which contacts the first common line 109a through a first common contact hole 166a and overlaps the first common line 109a, is formed in the first domain "D1". Namely, the second auxiliary common pattern 172a extends to be parallel to the first common line 109a. The plurality of first common electrodes 173a are branched from the second auxiliary common pattern 172a to be parallel to the data line 135.

Furthermore, a first auxiliary pixel pattern 168a, which contacts the drain electrode 141 through a drain contact hole 165, is formed in the first domain "D1". The plurality of first pixel electrodes 170a are branched from the first auxiliary pixel pattern 186a to be parallel to the data line 135. The plurality of first pixel electrodes 170a are alternately arranged with and parallel to the plurality of first common electrodes 173a.

In the second domain "D2", a third auxiliary common pattern 111b, which extends from the second common line 109b to the gate line 103 and forms a "C" shape with the second common line 109b, is formed. Namely, the third auxiliary common pattern 111b extends to the gate line 103 and is bent to be parallel to the gate line 103. The third auxiliary common pattern 111b serves as a third storage electrode of a second storage capacitor "StgC2".

In addition, a second auxiliary pixel pattern 168b extending from the first auxiliary pixel pattern 168a, which contacts the drain electrode 141, is formed. The second auxiliary pixel pattern 168b corresponds to the third auxiliary common pattern 111b. Namely, the second auxiliary pixel pattern 168b overlaps the third auxiliary common pattern 111b and serves as a fourth storage electrode of the second storage capacitor "StgC2". The third auxiliary common pattern 111b and the second auxiliary pixel pattern 168b forms the second storage capacitor "StgC2". The plurality of second pixel electrodes 170b are branched from the second auxiliary pixel pattern 168b. The plurality of second pixel electrodes 170b cross the data line 135. For example, the plurality of second pixel electrodes 170b in the second domain "D2" are perpendicular to the plurality of first pixel electrodes 170a in the first domain "D1". The first plurality of pixel electrodes 170a is substantially parallel to the data line 135, while the plurality of second pixel electrodes 173a is substantially perpendicular to the data line 135.

Furthermore, a fourth auxiliary common pattern 172b is formed in the second domain "D2". The fourth auxiliary common pattern 172b contacts the second common line 109b through a second common contact hole 166b and extends to be parallel to the data line 135. The fourth auxiliary common pattern 172b is disposed at one side of the second domain "D2". As a result, the fourth auxiliary common pattern 172b faces the third auxiliary common pattern 111b. The plurality of second common electrodes 173b are branched from the fourth auxiliary common pattern 172b and alternately arranged with the plurality of second pixel electrodes 170b.

The first common line 109a between the first domains "D1" of adjacent two pixel regions "P" is parallel to the gate line 103, while the second common line 109b between the second domains "D2" of adjacent two pixel regions "P" is oblique to the gate line 103. The first common line 109b has a straight line shape, while the second common line 109b has a stair shape.

In the array substrate for the IPS mode LCD device according to the present invention having the above arrangement, a director of liquid crystal molecules driven by a horizontal electric field between the first pixel electrodes 170a and the first common electrodes 173a is always perpendicular to a director of liquid crystal molecules driven by a horizontal electric field between the second pixel electrodes 170b and the second common electrodes 173b regardless of a driving voltage. As a result, a color shift problem is prevented at whole gray levels.

In addition, since the same domains are disposed at both side of each of the first and second common lines 109a and 109b, one boundary of the first and second domains "D1" and "D2" has a distance from adjacent another boundary along the gate line 130. When the array substrate according to the present invention has the same size of the pixel region "P" and the same number of the pixel regions "P" as the related art array substrate, the number of the boundary of the first and second domains "D1" and "D2" is halved. On the other hand, the first and second domains "D1" and "D2" are differently aligned by scan-type UV irradiating. Accordingly, an aligning process time for different alignment is reduced. Moreover, since the same domain in different pixel regions P is continuous, a relatively low resolution UV irradiating apparatus is enough. As a result, production costs are reduced.

Figure 8:
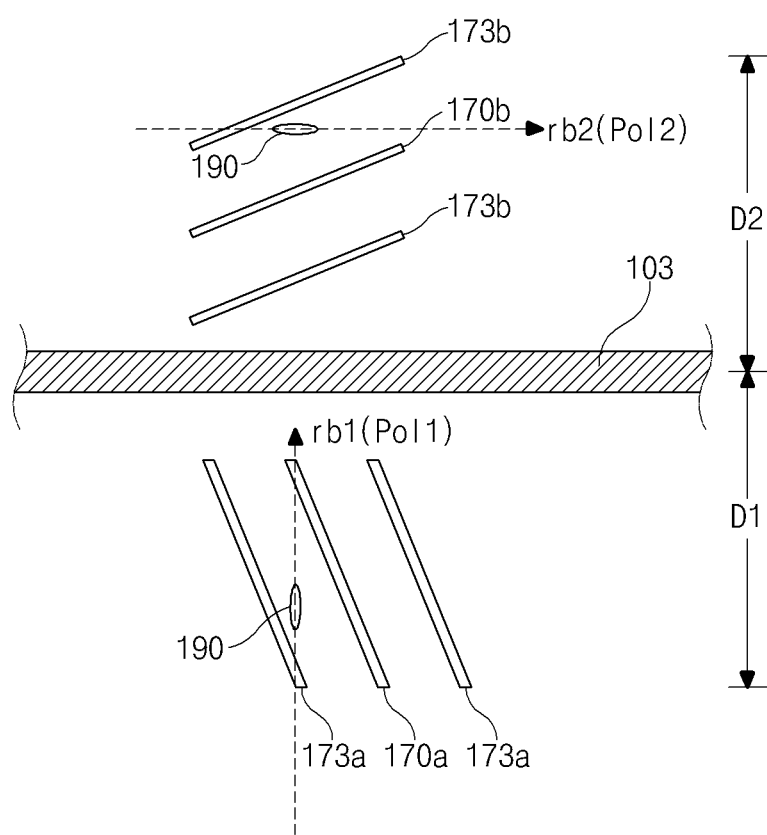
FIG. 8 is a schematic view showing common electrodes, pixel electrodes and a gate line of an array substrate for an IPS mode LCD device according to the present invention.

Referring to FIG. 8, which is a schematic view showing common electrodes, pixel electrodes and a gate line of an array substrate for an IPS mode LCD device according to the present invention, with FIG. 5, first and second polarizer (not shown), which are disposed at outer sides of the LCD device, respectively have first and second polarizing axes "Pol1" and "Pol2". The first polarizing axis "Pol1" is substantially parallel to the gate line 103, while the second polarizing axis "Pol2" is substantially perpendicular to the gate line 103. In this case, a first rubbing direction "rb1" in the first domain "D1" is substantially parallel to the gate line 103, while a second rubbing direction "rb2" in the second domain "D2" is substantially perpendicular to the gate line 103. Namely, the first and second rubbing directions "rb1" and "rb2" are respectively parallel to the first and second polarizing axes "Pol1" and "Pol2".

As a result, with no voltage, a director of the liquid crystal molecules 190 in the first domain "D1" and a director of the liquid crystal molecules 190 in the second domain "D2" are respectively parallel to the first and second rubbing directions "rb1" and "rb2". Since the initial arrangement of the directors of the liquid crystal molecules 190 in the first and second domains "D1" and "D2" are parallel to or perpendicular to the first and second polarizing axes "Pol1" and "Pol2", the LCD device has a black mode. In addition, since the first and second rubbing directions "rb1" and "rb2" in the first and second domains "D1" and "D2" are perpendicular to each other, a color shift problem is not generated.

Moreover, since one of the first and second polarizing axes "Pol1" and "Pol2" is parallel to the gate line 103, the LCD device produces a maximum black image at a front view. As a result, a contrast ratio of the LCD device is improved.

Figure 6:
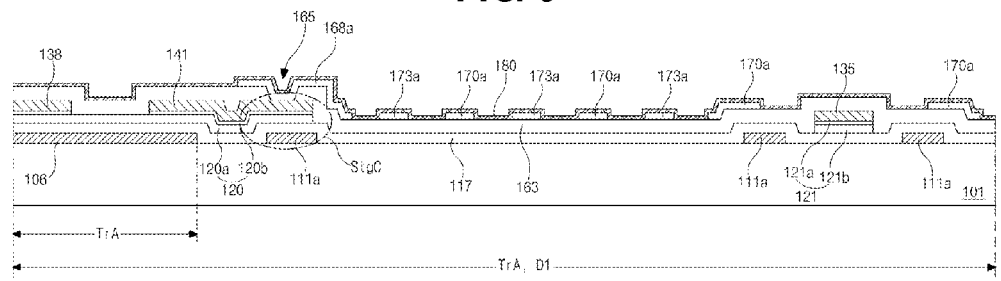
FIG. 6 is a cross-sectional view taken along the line VI-VI of FIG. 5.
Figure 7:
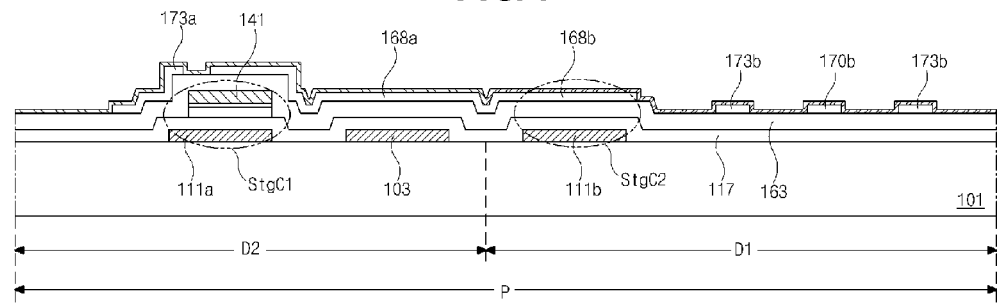
FIG. 7 is a cross-sectional view taken along the line VII-VII of FIG. 5.

FIG. 6 is a cross-sectional view taken along the line VI-VI of FIG. 5, and FIG. 7 is a cross-sectional view taken along the line VII-VII of FIG. 5. For convenience of explanation, a switching region "TrA", where the TFT as a switching element is formed, is defined.

Referring to FIGS. 6 and 7 with FIG. 5, the gate lines 103 having a straight line shape is formed on the substrate 101. The gate line 103 extends across a center of the pixel region "P". The first and second common lines 109a and 109b are respectively disposed at opposite end of the pixel region "P". The first common line 109b has a straight line shape, while the second common line 109b has a stair shape. In addition, the gate electrode 106 extending from the gate line 103 is formed in the switching region "TrA". Moreover, the first auxiliary common pattern 111a, which extends from the first common line 109a and forms a rectangular shape with the first common line 109a, and the third auxiliary common pattern 111b, which extends from the second common line 109b and forms a "C" shape with the second common line 109b, are respectively formed in the first and second domains "D1" and "D2".

A gate insulating layer 117 is formed on the gate line 103, the gate electrode 106, the first and second common lines 109a and 109b, and the first and third auxiliary common patterns 111a and 1116b. For example, the gate insulating layer 117 may be formed of an inorganic insulating material, for example, silicon oxide or silicon nitride.

A semiconductor layer 120 including an active layer 120a and an ohmic contact layer 120b is formed on the gate insulating layer and in the switching region "TrA". The active layer 120a includes intrinsic amorphous silicon, and the ohmic contact layer 120b includes impurity-doped amorphous silicon.

The source electrode 138 and the drain electrode 141, which is spaced apart from the source electrode 138, are formed on the semiconductor layer 120. The data line 135, which crosses the gate line 103 to define the pixel region "P", is formed on the gate insulating layer 117. The data line 135 has a bent portion at a crossing portion of the gate line 103. Namely, the data line 135 has a zigzag shape. The source electrode 138 is connected to the data line 135. The drain electrode 141 extends to overlap a portion of the first auxiliary common pattern 111a. The overlapped portion of the first auxiliary common pattern 111a, the overlapped portion of the drain electrode 141 and the gate insulating layer 117 therebetween constitute the first storage capacitor "StgC1". The gate electrode 103, the gate insulating layer 117, the semiconductor layer 120, the source electrode 138 and the drain electrode 141 constitute the TFT "Tr". The TFT "Tr" is connected to the gate and data lines 103 and 135.

A passivation layer 163 is formed on the data line 135 and the TFT "Tr". The passivation layer 163 includes the first and second common contact holes 166a and 166b, which respectively expose the first and second common lines 109a and 109b, and the drain contact hole 165 exposing the drain electrode 141.

The second auxiliary common pattern 172a and the first common electrodes 173a are formed on the passivation layer 163 and in the first domain "D1". Each of the second auxiliary common pattern 172a and the first common electrodes 173a is formed of a transparent conductive material, for example, indium-tin-oxide (ITO) or indium-zinc-oxide (IZO). The second auxiliary common pattern 172a contacts the first common line 109a through the first common contact hole 166a and overlaps the first common line 109a. The first common electrodes 173a extend from the second auxiliary common pattern 172a.

In addition, the first auxiliary pixel pattern 168a and the first pixel electrodes 170a are formed on the passivation layer 163 and in the first domain "D1". The first auxiliary pixel pattern 168a contacts the drain electrode 141 through the drain contact hole 165. The first pixel electrodes 170a extend from the first auxiliary pixel pattern 168a and alternately arranged with the first common electrodes 173a.

The second auxiliary pixel pattern 168b, the second pixel electrodes 170b, the fourth auxiliary common pattern 172b, and the second common electrodes 173b are formed on the passivation layer 163 in the second domain "D2". The second auxiliary pixel pattern 168b is connected to the first auxiliary pixel pattern 168a and overlaps the third auxiliary common pattern 111b. The overlapped portion of the third auxiliary common pattern 111b, and the overlapped portion of the second auxiliary pixel pattern 168b, and the gate insulating layer 117 and the passivation layer 163 therebetween constitute the second storage capacitor "StgC2". The second pixel electrodes 170b extends from the second auxiliary pixel pattern 168b and perpendicular to the first pixel electrodes 170a in the first domain "D1". The fourth auxiliary common pattern 172b contacts the second common line 109b through the second common contact hole 166b and faces the third auxiliary common pattern 111b. The second common electrodes 173b extend from the fourth auxiliary common pattern 172b and are alternately arranged with the second pixel electrodes 170b. For example, the second common auxiliary pattern 172b, the first common electrodes 173a, the first auxiliary pixel pattern 168a, the first pixel electrodes 170a, the second auxiliary pixel pattern 168b, the second pixel electrodes 170b, the fourth auxiliary common pattern 172b and the second common electrodes 173b may be formed of the same material.

An alignment layer 180 is formed on the first and second pixel electrodes 170a and 170b and the first and second common electrodes 173a and 173b. The alignment layer 180 in the first domain "D1" is aligned to be substantially perpendicular to the gate line 103, while the alignment layer 180 in the second domain "D2" is aligned to be substantially parallel to the gate line 103. The aligning process is performed by a UV irradiating apparatus being capable of being controlled in several micrometers. The alignment layer 180 has a plurality of functional groups on their surface. The functional groups react with the UV to align along one direction.

Referring to FIGS. 9A to 9F and 10A to 10F with FIG. 5, a fabricating process of an array substrate for an IPS mode LCD device according to the present invention is explained below. FIGS. 9A to 9F are cross-sectional view showing a fabricating process of a portion taken along the line VI-VI of FIG. 5, and FIGS. 10A to 10F are cross-sectional view showing a fabricating process of a portion taken along the line VII-VII of FIG. 5.

Figure 9A:
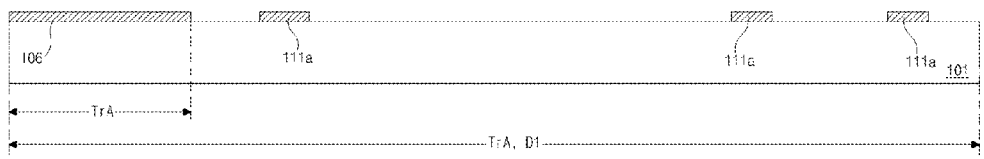
FIGS. 9A to 9F are cross-sectional view showing a fabricating process of a portion taken along the line VI-VI of FIG. 5.
Figure 10A:
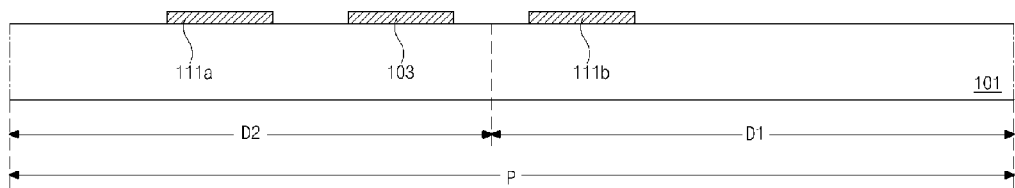
FIGS. 10A to 10F are cross-sectional view showing a fabricating process of a portion taken along the line VII-VII of FIG. 5.

As shown in FIGS. 9A and 10A with FIG. 5, a first metal layer (not shown) is formed on a substrate 101 by depositing a first metallic material. The first metallic material may include one of aluminum (Al), Al alloy (AlNd), copper (Cu), Cu alloy, chromium (Cr) and molybdenum (Mo). The first metal layer is patterned to form the gate line 103 along one direction and the gate electrode 106 connected to the gate line 103. The gate electrode 106 is disposed in the switching region "TrA". At the same time, the first and second common lines 109a and 109b at boundaries of the pixel region "P", the first auxiliary common pattern 111a and the third auxiliary common pattern 111b are formed on the substrate 101. The first and second common lines 109a and 109b are alternately arranged with each other and respectively have a straight line shape and a stair shape. The first auxiliary common pattern 111a extends from the first common line 109a and is disposed in the first domain "D1". The third auxiliary common pattern 111b extends from the second common line 109b and is disposed in the second domain "D2".

Figure 9B:
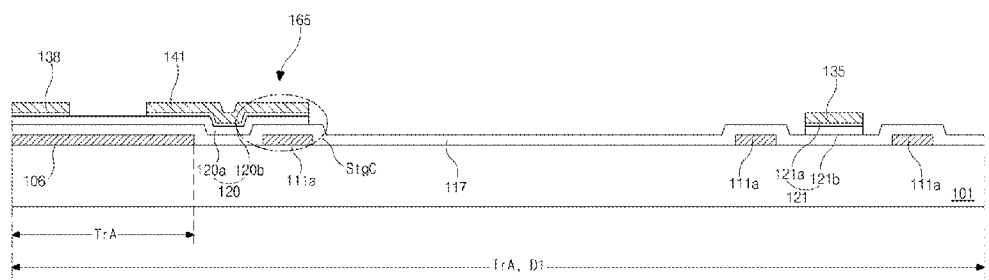
Figure 10B:
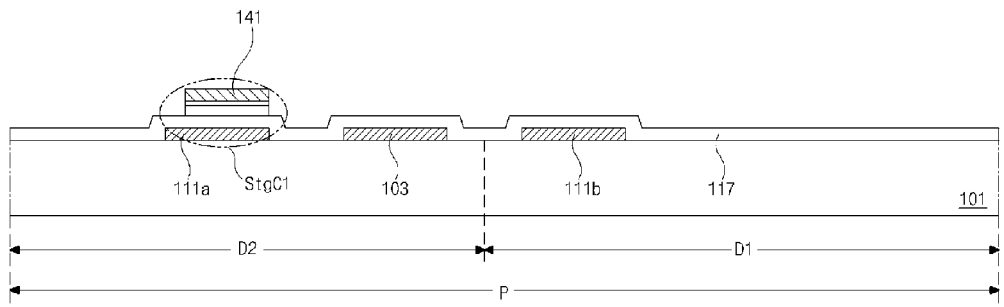

Next, as shown in FIGS. 9B and 10B with FIG. 5, the gate insulating layer 117 is formed on the gate line 103, the gate electrode 106, the first and second common lines 109a and 109b, and the first and third auxiliary common patterns 111a and 1116b by depositing an inorganic insulating material, for example, silicon oxide or silicon nitride.

Next, an intrinsic amorphous silicon layer (not shown), an impurity-doped amorphous silicon layer (not shown), and a second metal layer (not shown) are sequentially formed on the gate insulating layer 117 by depositing intrinsic amorphous silicon, impurity-doped amorphous silicon, and a second metallic material. The an intrinsic amorphous silicon layer (not shown), an impurity-doped amorphous silicon layer (not shown), and a second metal layer (not shown) are patterned using a refractive exposing method or a half-tone exposing method to form the active layer 120a of intrinsic amorphous silicon, the ohmic contact layer 120b of impurity-doped amorphous silicon and the source and drain electrodes 138 and 141 of the second metallic material. For example, the second metallic material may include one of aluminum (Al), Al alloy (AlNd), copper (Cu), Cu alloy, chromium (Cr) and molybdenum (Mo). The active layer 120a and the ohmic contact layer 120b constitute the semiconductor layer 120. At the same time, the data line 135, which crosses the first and second common lines 109a and 109b to define the pixel region "P" and is connected to the source electrode 138, is formed on the gate insulating layer 117. The data line 135 has a bent portion at a crossing portion with the gate line 103. Namely, the date line 130 has a zigzag shape. The drain electrode 141 extends to overlap a portion of the first auxiliary common pattern 111a. The overlapped portion of the first auxiliary common pattern 111a, the overlapped portion of the drain electrode 141 and the gate insulating layer 117 therebetween constitute the first storage capacitor "StgC1".

Because of the refractive exposing method or the half-tone exposing method, there are first and second dummy patterns 121a and 121b respectively from the impurity-doped amorphous silicon layer and the intrinsic amorphous silicon layer. However, when the semiconductor layer 120 and the source and drain electrodes 138 and 141 are formed by different mask process, the first and second dummy patterns 121a and 121b are not formed.

Figure 9C:
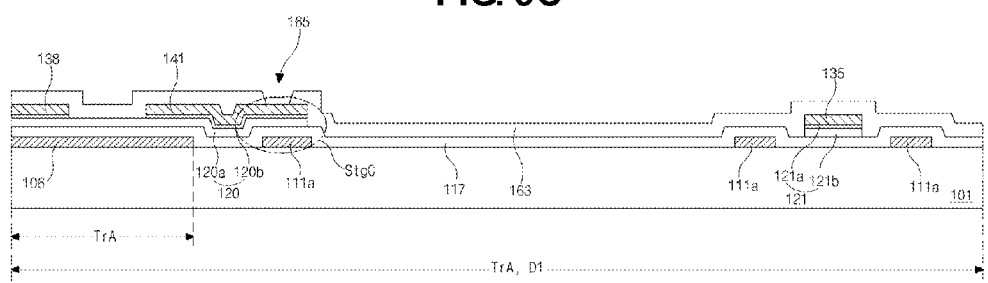
Figure 10C:
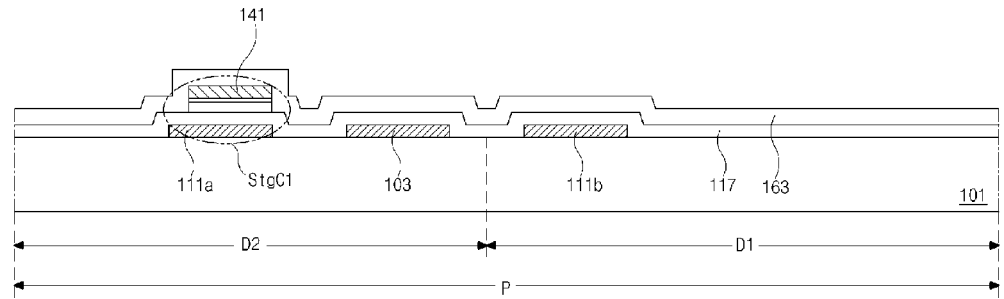

Next, as shown in FIGS. 9C and 10C with FIG. 5, the passivation layer 163 is formed on the data line 135 and the source and drain electrodes 138 and 141 by depositing an inorganic insulating material, for example, silicon oxide or silicon nitride. Then, the passivation layer 163 is patterned by a mask process to form the first and second common contact holes 166a and 166b, which respectively expose the first and second common lines 109a and 109b, and the drain contact hole 165 exposing the drain electrode 141.

Figure 9D:
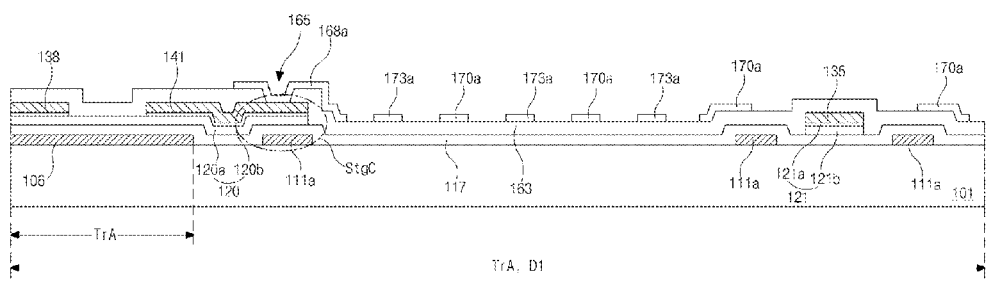
Figure 10D:
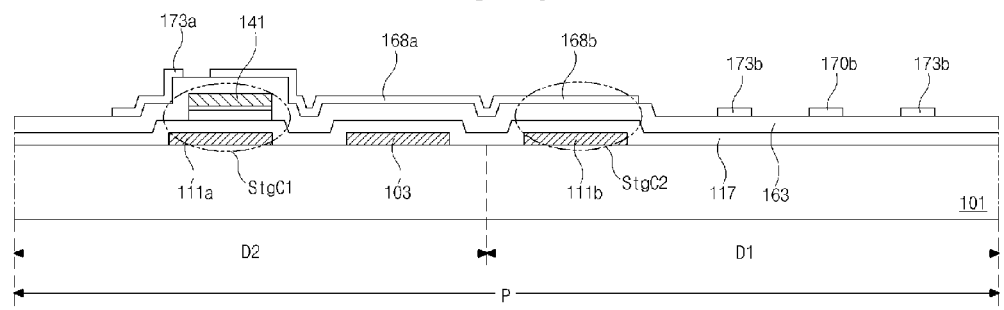

Next, as shown in FIGS. 9D and 10D with FIG. 5, a transparent conductive material layer (not shown) is formed on the passivation layer 163 by depositing a transparent conductive material, for example, ITO or IZO. The transparent conductive material layer is patterned to form the second and fourth auxiliary common patterns 172a and 172b, the first and second auxiliary pixel patterns 168a and 168b, the first and second common electrodes 173a and 173b and the first and second pixel electrodes 170a and 170b. The second and fourth auxiliary common patterns 172a and 172b, the first and second auxiliary pixel patterns 168a and 168b, the first and second common electrodes 173a and 173b and the first and second pixel electrodes 170a and 170b respectively have the above explained plane-shapes. The first auxiliary pixel pattern 168a contacts the drain electrode 141 through the drain contact hole 165. The second auxiliary common pattern 172a contacts the first common line 109a through the first common contact hole 166a, and the fourth auxiliary common pattern 172b contacts the second common line 109b through the second common contact hole 166b.

Figure 9E:
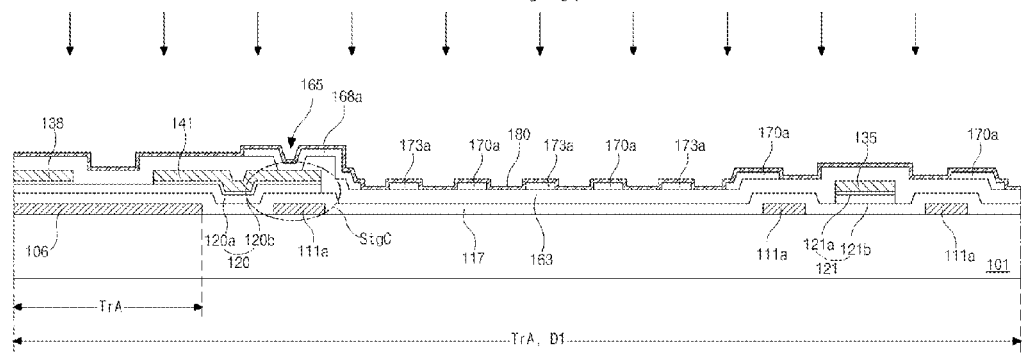
Figure 10E:
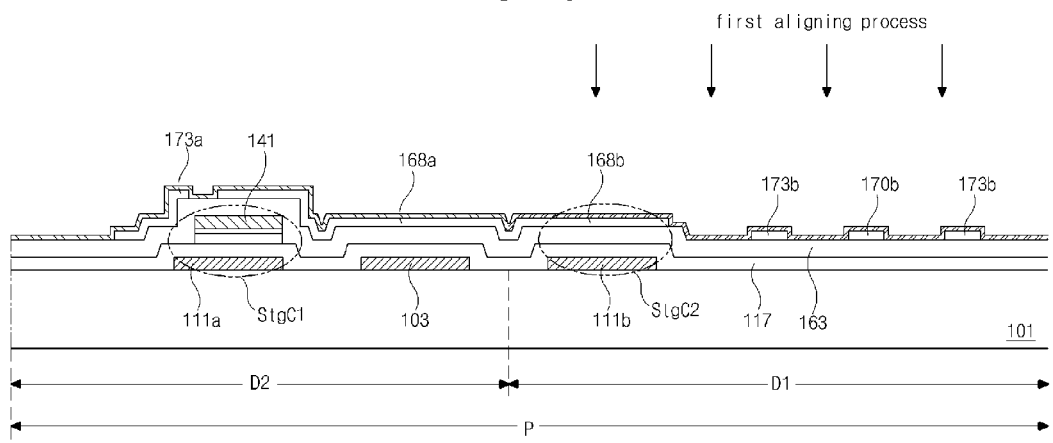

Next, as shown in FIGS. 9E and 10E with FIG. 5, the alignment layer 180 is formed on the first and second pixel electrodes 170a and 170b and the first and second common electrodes 173a and 173b by coating a polymeric material. The polymeric material has a plurality of functional groups, which react with the UV to align along one direction, on their surface. For example, the polymeric material may include polyimide.

Next, the alignment layer 180 in the first domain "D1" is aligned along the first rubbing direction "rb1", which is substantially perpendicular to the gate line 103, using the UV irradiating apparatus (not shown). (first aligning process) As a result, the function groups of the alignment layer 180 in the first domain "D1" is aligned along the first rubbing direction "rb1" such that a director of the liquid crystal molecules 190 in the first domain "D1" is initially arranged along the first rubbing direction "rb1".

Figure 9F:
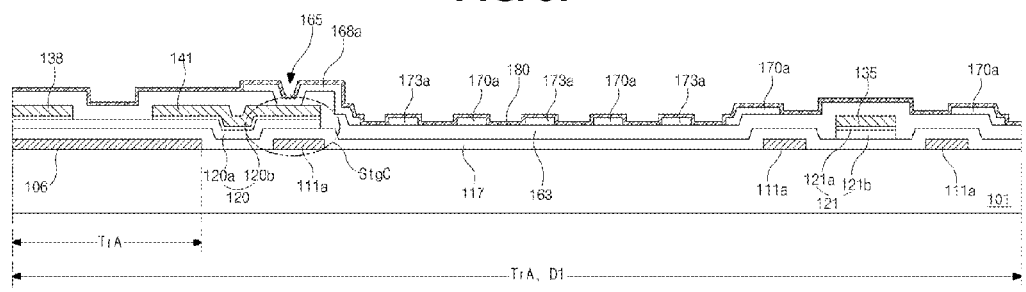
Figure 10F:
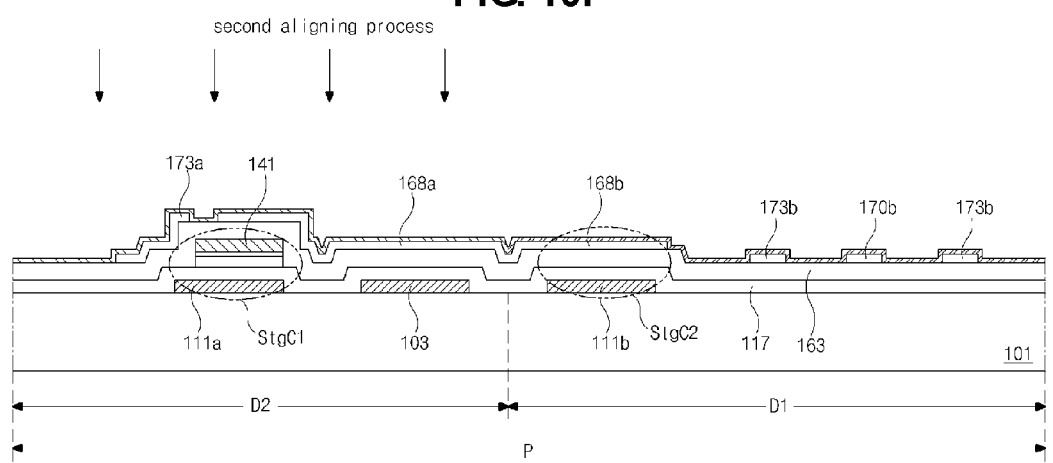

Next, as shown in FIGS. 9F and 10F with FIG. 5, the alignment layer 180 in the second domain "D2" is aligned along the second rubbing direction "rb2", which is perpendicular to the first rubbing direction "rb1", using the UV irradiating apparatus (not shown). (second aligning process) As a result, the function groups of the alignment layer 180 in the second domain "D2" is aligned along the second rubbing direction "rb2" such that a director of the liquid crystal molecules 190 in the second domain "D2" is initially arranged along the second rubbing direction "rb2".

Next, although not shown, a polarizing plate, which has a polarizing axis being parallel or perpendicular to the gate line 103, may be formed on an outer side of the substrate 101.

In the present invention, since the director of the liquid crystal molecules in one domain is perpendicular to that in the other domain irrespective of applied voltages, a color shift problem is prevented.

In addition, since the domains in one pixel region and the domains in adjacent pixel region have different domain arrangements, the color shift problem is further prevented.

Moreover, since a boundary of domains overlaps the gate line, decrease of an aperture ratio is prevented.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate for an in-plane switching mode liquid crystal display device, comprising:
    first and second gate lines on a substrate including first and second pixel regions, the first pixel region including a first domain at a lower side with respect to the first gate line and a second domain at an upper side with respect to the first gate line, and the second pixel region including a first domain at an upper side with respect to the second gate line and a second domain at a lower side with respect to the second gate line;
    a data line crossing the first and second gate lines;
    a thin film transistor in each of the first and second pixel regions and at a crossing portion of each of the first and second gate lines and the data line;
    a plurality of first pixel electrodes in the first domain of the first and second pixel regions;
    a plurality of second pixel electrodes in the second domain of the first and second pixel regions, the plurality of first pixel electrodes and plurality of second pixel electrodes sharing the thin film transistor;
    a plurality of first common electrodes in the first domain of the first and second pixel regions and alternately arranged with the plurality of first pixel electrodes; and
    a plurality of second common electrodes in the second domain of the first and second pixel regions and alternately arranged with the plurality of second pixel electrodes,
    wherein the plurality of first pixel electrodes in the first domain of the first and second pixel regions has substantially the same direction.

2. The array substrate according to claim 1, further comprising:
    a first common line extending to cross the data line; and
    a second common line extending to cross the data line,
    wherein the first gate line is disposed between the first and second common lines, and a region between the first common line and the first gate line is defined by the first domain, and a region between the second common line and the first gate line is defined by the second domain.

3. The array substrate according to claim 2, wherein the plurality of first common electrodes are connected to the first common line, and the plurality of second common electrodes are connected to the second common line.

4. The array substrate according to claim 1, further comprising:
    a first alignment layer in the first domain and having a first rubbing direction; and
    a second alignment layer in the second domain and having a second rubbing direction.

5. The array substrate according to claim 4, wherein the first rubbing direction is substantially perpendicular to the second rubbing direction.

6. The array substrate according to claim 5, wherein the first rubbing direction is substantially perpendicular to the first and second gate lines.

7. The array substrate according to claim 1, wherein the plurality of first pixel electrodes are substantially perpendicular to the plurality of second pixel electrodes.

8. The array substrate according to claim 1, wherein the data line has a bent portion at a crossing portion with the first and second gate lines.

9. The array substrate according to claim 8, wherein the plurality of first pixel electrodes are substantially parallel to the data line in the first domain, and the plurality of second pixel electrodes are oblique to the data line in the second domain.

10. The array substrate according to claim 1, wherein two first domains and two second domains are alternately arranged with each other along the data line.

11. An array substrate for an in-plane switching mode liquid crystal display device, comprising:
    a gate line on a substrate including a pixel region, the pixel region including a first domain at a lower side with respect to the gate line and a second domain at an upper side with respect to the gate line;
    a data line crossing the gate line;
    a thin film transistor in the pixel region and at a crossing portion of the gate and data lines;
    a plurality of first pixel electrodes in the first domain;
    a plurality of second pixel electrodes in the second domain, the plurality of first pixel electrodes and plurality of second pixel electrodes sharing the thin film transistor;
    a plurality of first common electrodes in the first domain and alternately arranged with the plurality of first pixel electrodes;
    a plurality of second common electrodes in the second domain and alternately arranged with the plurality of second pixel electrodes;
    a first common line extending to cross the data line; and
    a second common line extending to cross the data line,
    wherein the first common line has a straight line shape along the gate line, and the second common line has a stair shape along the gate line,
    wherein the gate line is disposed between the first and second common lines,
    wherein a region between the first common line and the gate line is defined by the first domain, and
    wherein a region between the second common line and the gate line is defined by the second domain.

12. An array substrate for an in-plane switching mode liquid crystal display device, comprising:
    a gate line on a substrate including a pixel region, the pixel region including a first domain at a lower side with respect to the gate line and a second domain at an upper side with respect to the gate line;
    a data line crossing the gate line;
    a thin film transistor in the pixel region and at a crossing portion of the gate and data lines;
    a plurality of first pixel electrodes in the first domain;

a plurality of second pixel electrodes in the second domain, the plurality of first pixel electrodes and plurality of second pixel electrodes sharing the thin film transistor;

a plurality of first common electrodes in the first domain and alternately arranged with the plurality of first pixel electrodes;

a plurality of second common electrodes in the second domain and alternately arranged with the plurality of second pixel electrodes;

a first common line extending to cross the data line;

a second common line extending to cross the data line;

a first auxiliary common pattern in the first domain and extending from the first common line;

a second auxiliary common pattern in the first domain and overlapping the first common line, the second auxiliary common pattern disposed at a different layer from the first common line and contacting the first common line;

a first auxiliary pixel pattern in the first domain and connected to the thin film transistor;

a third auxiliary common pattern in the second domain and extending from the second common line;

a fourth auxiliary common pattern in the second domain and facing the third auxiliary common pattern, the fourth auxiliary common pattern disposed at a different layer from the second common line and contacting the second common line; and a second auxiliary pixel pattern in the second domain and connected to the first auxiliary pixel pattern, wherein the gate line is disposed between the first and second common lines, wherein a region between the first common line and the gate line is defined by the first domain, and wherein a region between the second common line and the gate line is defined by the second domain.

13. The array substrate according to claim 12, wherein the first auxiliary common pattern with the first common line forms a rectangular shape, and the third auxiliary common pattern with second common line forms a C-shape.

14. The array substrate according to claim 12, wherein the first auxiliary pixel pattern overlaps the first auxiliary common pattern, and the second auxiliary pattern overlaps the third auxiliary common pattern.

15. The array substrate according to claim 12, wherein the plurality of first pixel electrodes extend from the first auxiliary pixel pattern, and the plurality of second pixel electrodes extend from the second auxiliary pixel pattern.

16. The array substrate according to claim 12, wherein the plurality of first common electrodes extend from the second auxiliary common pattern, and the plurality of second common electrodes extend from the fourth auxiliary common pattern.

17. A method of fabricating an array substrate for an in-plane switching mode liquid crystal display device, the method comprising:

forming a gate line, a first common lin; and a second common line on a substrate comprising a pixel region, the gate line disposed between the first and second common lines;

forming a data line over the gate line, the first and second common lines, the data line crossing the first and second common line to define first and second domains in the pixel region, respectively;

forming a thin film transistor in the pixel region and at a crossing portion of the gate line and the data line;

forming a plurality of first pixel electrodes in the first domain, a plurality of second pixel electrodes in the second domain, a plurality of first common electrodes in the first domain, and a plurality of second common electrodes in the second domain, wherein the plurality of first pixel electrodes and plurality of second pixel electrodes share the thin film transistor, wherein the plurality of first common electrodes are alternately arranged with the plurality of first pixel electrodes, wherein the plurality of second common electrodes are alternately arranged with the plurality of second pixel electrodes, wherein the forming the gate line, the first common line, and the second common lines comprises forming a first auxiliary common pattern in the first domain and extending from the first common line, and a third auxiliary common pattern in the second domain and extending from the second common line, wherein the forming the plurality of first pixel electrodes, the plurality of second pixel electrodes, the plurality of first common electrodes, and the plurality of second common electrodes comprises forming a second auxiliary common pattern in the first domain and overlapping the first common line, a first auxiliary pixel pattern in the first domain and connected to the thin film transistor, a fourth auxiliary common pattern in the second domain and facing the third auxiliary common pattern, and a second auxiliary pixel pattern in the second domain and connected to the first auxiliary pixel pattern, wherein the second auxiliary common pattern is disposed at a different layer from the first common line and contacts the first common line, and wherein the fourth auxiliary common pattern is disposed at a different layer from the second common line and contacts the second common line.

18. The method according to claim 17, further comprising:

forming an alignment layer on the plurality of first pixel electrodes, the plurality of second pixel electrodes, the plurality of first common electrodes, and the plurality of second common electrodes;

aligning a first portion of the alignment layer such that the alignment layer in the first domain is aligned along a first direction; and aligning a second portion of the alignment layer such that the alignment layer in the second domain is aligned along a second direction.

19. The method according to claim 18, wherein the first direction is substantially perpendicular to the second direction.

20. The method according to claim 19, wherein the first direction is substantially perpendicular to the gate line.

* * * * *